US010128424B2

(12) United States Patent
Herrmann

(10) Patent No.: US 10,128,424 B2
(45) Date of Patent: Nov. 13, 2018

(54) METHOD FOR PRODUCING OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/553,565

(22) PCT Filed: Feb. 12, 2016

(86) PCT No.: PCT/EP2016/053018
§ 371 (c)(1),
(2) Date: Aug. 24, 2017

(87) PCT Pub. No.: WO2016/134981
PCT Pub. Date: Sep. 1, 2016

(65) Prior Publication Data
US 2018/0248091 A1    Aug. 30, 2018

(30) Foreign Application Priority Data
Feb. 25, 2015   (DE) .......... 10 2015 102 699

(51) Int. Cl.
*H01L 33/00*     (2010.01)
*H01L 33/62*     (2010.01)
(Continued)

(52) U.S. Cl.
CPC ............ *H01L 33/62* (2013.01); *H01L 33/486* (2013.01); *H01L 33/54* (2013.01); *H01L 21/561* (2013.01);
(Continued)

(58) Field of Classification Search
None
See application file for complete search history.

(56) References Cited

U.S. PATENT DOCUMENTS 7,838,868 B2 * 11/2010 Sheats ................. H01L 27/3204
  438/34
8,956,922 B2 *  2/2015 Peil .......................... H01L 33/54
  438/127

(Continued)

FOREIGN PATENT DOCUMENTS

DE    102009036621 A1    2/2011
DE    102011087886 A1    6/2013
(Continued)

OTHER PUBLICATIONS

Datasheet: "Temporary Wafer Bonding Material" Brewer Science WaferBOND HT-10.10; 2 pages, Aug. 9, 2011.

*Primary Examiner* — Chandra Chaudhari
(74) *Attorney, Agent, or Firm* — McDermott Will & Emery LLP

(57) ABSTRACT

The invention relates in at least one embodiment to the production of optoelectronic semiconductor components and comprises the steps: A) providing an intermediate carrier (2) having a plurality of fixing points (23), B) providing optoelectronic semiconductor chips (3) each having a chip upper side (30) and a mounting side (32) located opposite thereto, wherein electric contact points (34) of the semiconductor chips (3) are each located on the mounting sides (32), C) attaching connecting means (4), D) fixing the contact points (34) to the fixing points (23) by means of the connecting means (4), E) producing a potting layer (5), such that the semiconductor chips (3) and the contact points (34) and the connecting means (4) are directly surrounded all round by the potting layer (5), F) detaching the semiconductor chips (3), such that the connecting means (4) are (Continued)

Figure 1:
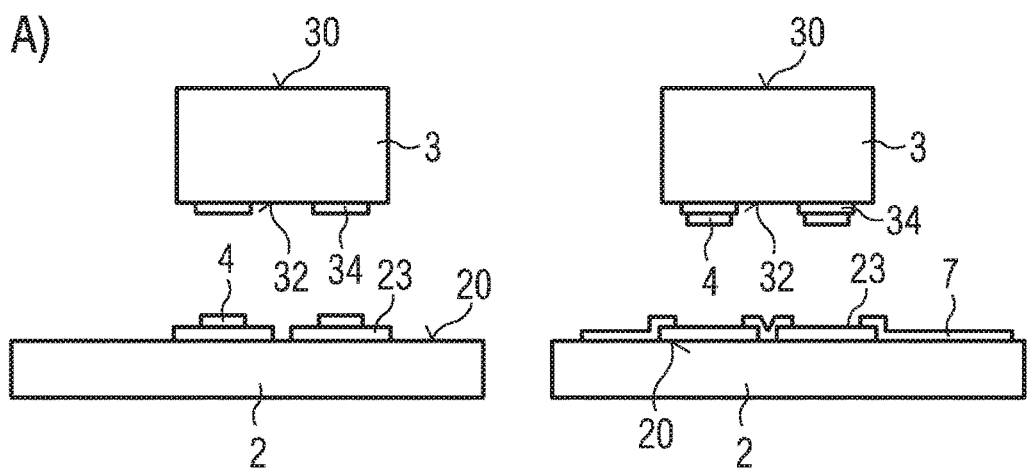
Figure 1:
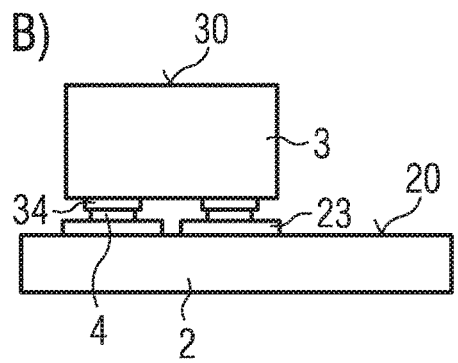
Figure 1:
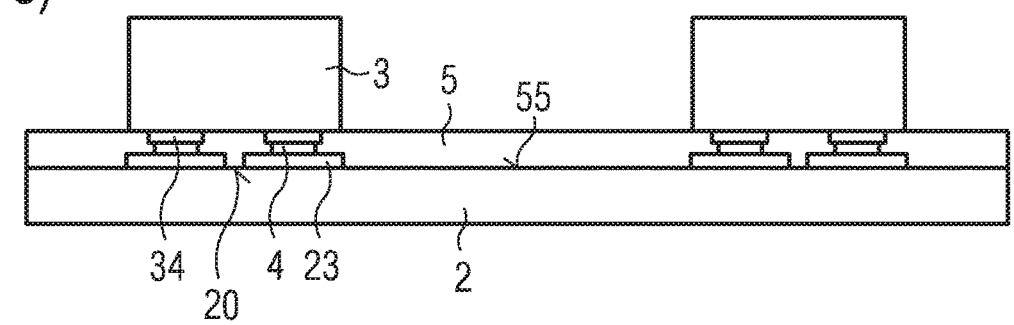
Figure 1:
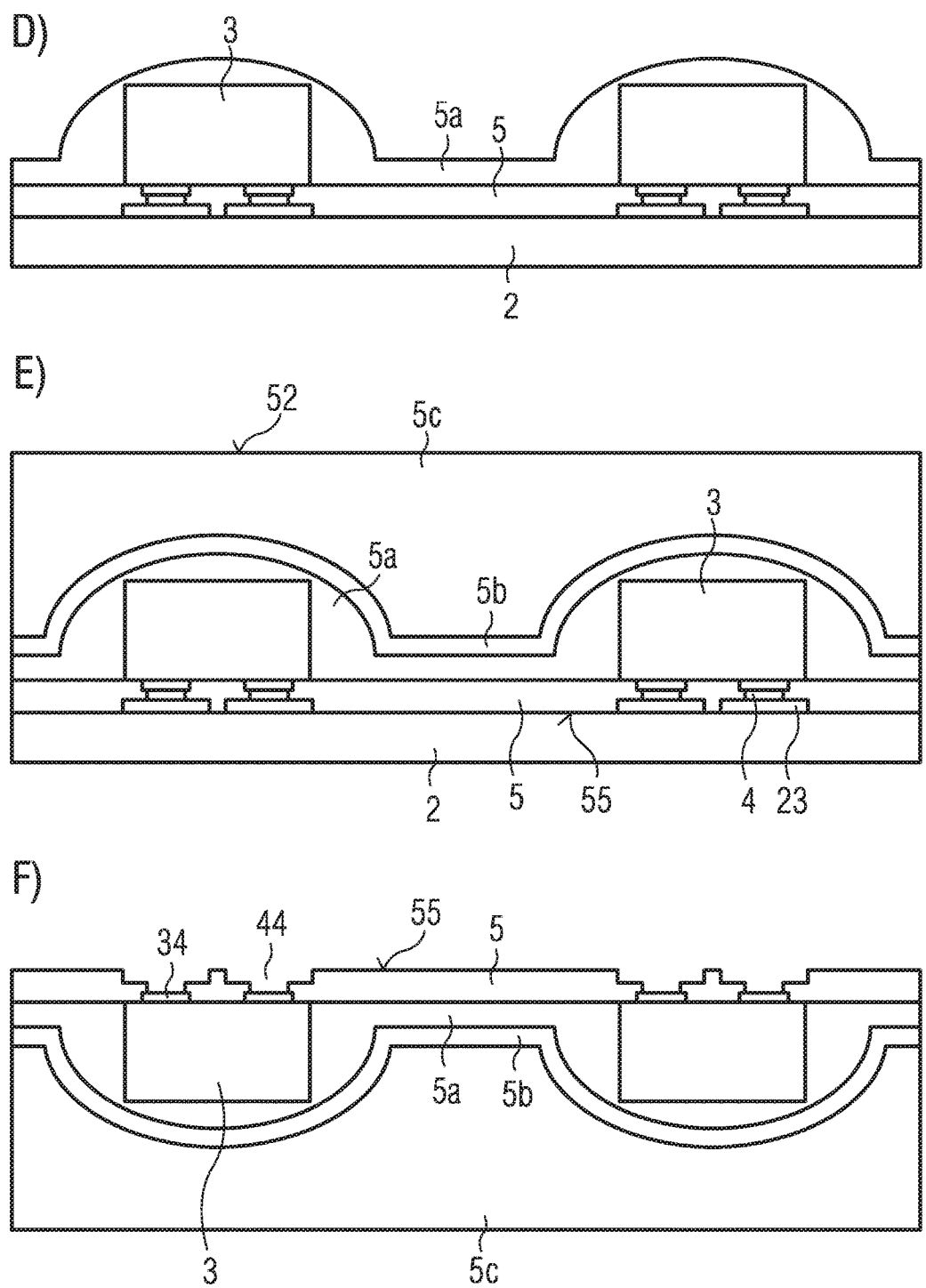
Figure 1:
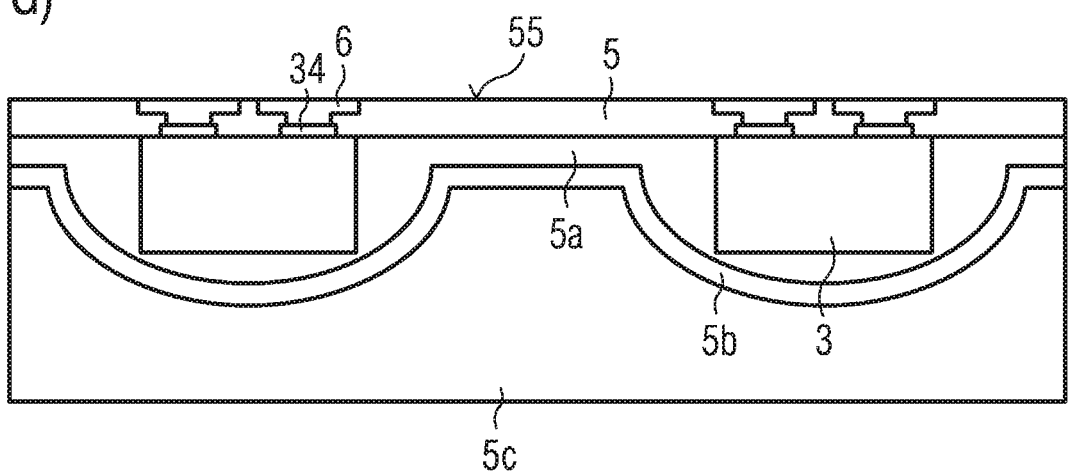
Figure 1:
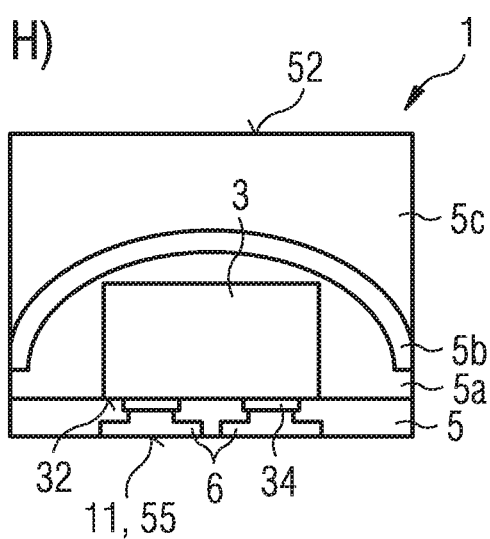

removed from the semiconductor chips (3) and recesses (44) are each provided at the contact points (34) as a negative form in relation to the connecting regions (4), and G) producing electric contact structures (6).

16 Claims, 8 Drawing Sheets

(51) Int. Cl.
   *H01L 33/48*    (2010.01)
   *H01L 33/54*    (2010.01)
   *H01L 21/56*    (2006.01)
(52) U.S. Cl.
   CPC ...... *H01L 21/568* (2013.01); *H01L 2933/005* (2013.01); *H01L 2933/0066* (2013.01)

(56)      References Cited

U.S. PATENT DOCUMENTS

| | | |
|---|---|---|
| 2010/0171135 A1 | 7/2010 | Engl et al. |
| 2014/0231850 A1 | 8/2014 | Tischler et al. |

FOREIGN PATENT DOCUMENTS

| | | |
|---|---|---|
| DE | 102012002605 A1 | 8/2013 |
| DE | 102012216552 A1 | 3/2014 |
| DE | 102013207611 A1 | 10/2014 |
| DE | 102015101143 A1 | 7/2016 |
| WO | 2015013399 A1 | 1/2015 |

\* cited by examiner

G)

H)

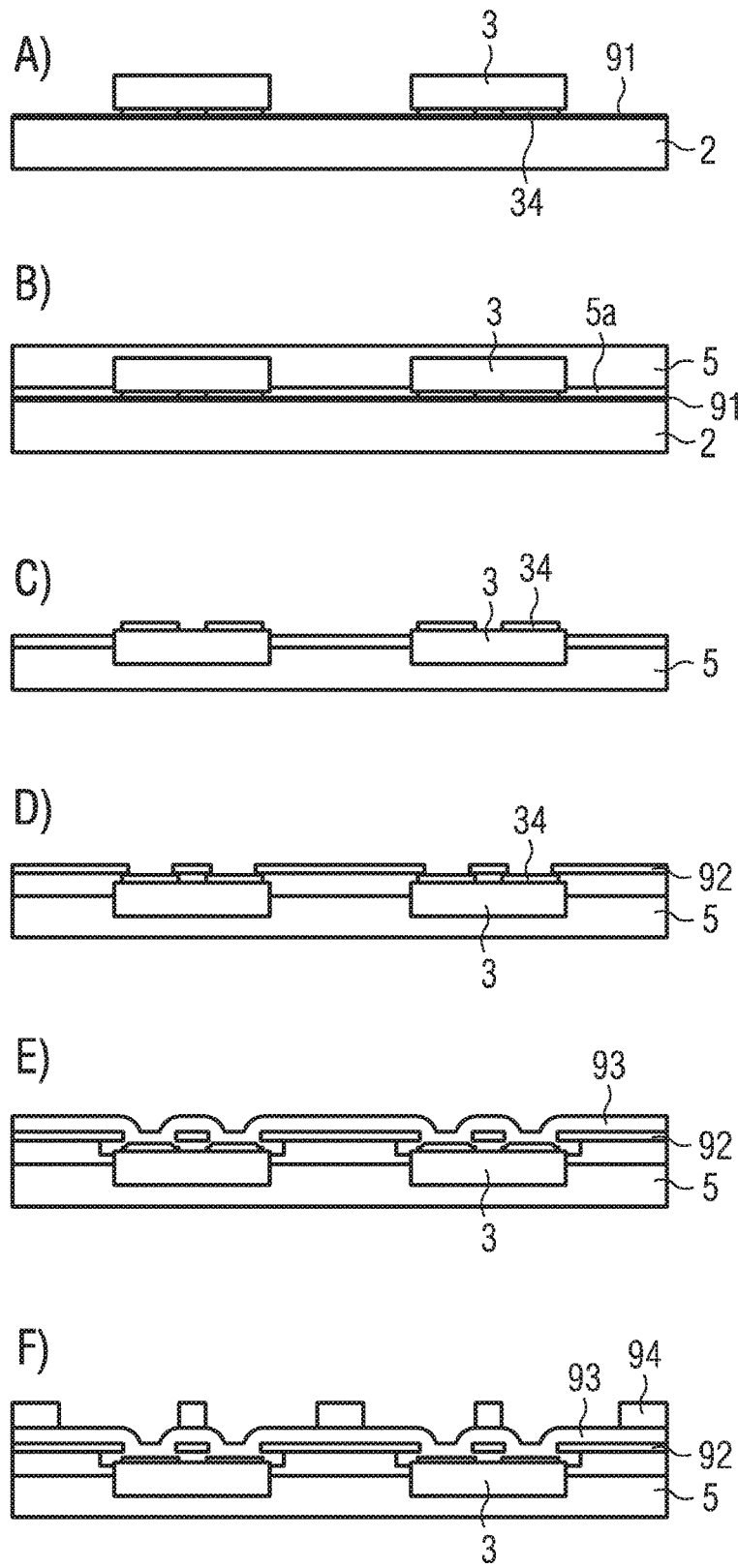

G)

H)

I)

METHOD FOR PRODUCING OPTOELECTRONIC SEMICONDUCTOR COMPONENTS AND OPTOELECTRONIC SEMICONDUCTOR COMPONENT

A method for producing optoelectronic semiconductor components is provided. In addition, an optoelectronic semiconductor component is provided.

An object to be achieved is to provide a method by which optoelectronic semiconductor components can be produced efficiently and inexpensively.

This object is achieved inter alia by a method and by an optoelectronic semiconductor component having the features of the independent claims. Preferred developments are provided by the dependent claims.

According to at least one embodiment, the method is designed for producing a plurality of optoelectronic semiconductor components. The production preferably takes place in a carrier composite. The finished semiconductor components are in particular LEDs or photodetectors.

According to at least one embodiment, the method comprises the step of providing an intermediate carrier. The intermediate carrier has a carrier top. On the carrier top, multiple fixing points are located. A material of the intermediate carrier can be an inorganic material, e.g. a glass or ceramic or a metal foil. Likewise, it is possible for organic materials to be used for the intermediate carrier, in particular polymers and especially thermosetting materials.

According to at least one embodiment, at least one optoelectronic semiconductor chip provided. The semiconductor chip is in particular an LED chip or a photodetector chip.

According to at least one embodiment, the semiconductor chip has a chip top and a mounting side opposite thereto. The chip top can be a main radiation side of the semiconductor chip. Preferably, when used as intended, the semiconductor chip emits radiation both on the chip top and on side surfaces of the semiconductor chip, wherein the side surfaces connect the chip top to the mounting side. In this case, the optoelectronic semiconductor chip can be a so-called volume emitter.

According to at least one embodiment, at least one or all of the electrical contact points of the semiconductor chips is/are located on the mounting side in each case. In particular, the semiconductor chip has precisely two electrical contact points, each of which is applied on the mounting side. In other words, the semiconductor chip in this case is a so-called flip chip.

According to at least one embodiment, multiple connecting means are applied locally at the contact points and/or at the fixing points. In other words, the connecting means are applied either at the contact points on the semiconductor chips or alternatively at the fixing points on the intermediate carrier. The term locally here means in particular that the connecting means is not applied over the entire surface but that the connecting means is applied in a limited fashion to the contact point and/or fixing points. The application of the connecting means takes place e.g. by a printing method or by a deposition method that only provides local wetting, in which a material of the connecting means adheres only to the fixing points, for example, and runs off other regions of the carrier top.

According to at least one embodiment, the contact points and thus the semiconductor chips are fixed to the fixing points of the intermediate carrier. The fixing takes place via the connecting means. Each contact point in this case is preferably connected one-to-one to the associated fixing point via precisely one connecting means. The semiconductor chips are fixed on the intermediate carrier in particular in such a way that no premature detachment of the semiconductor chips from the intermediate carrier takes place in the intended process sequence.

According to at least one embodiment, one or more potting layers is/are generated on the carrier top. As a result of the at least one potting layer, the semiconductor chips and the contact points, as well as preferably the connecting means, are completely surrounded by the potting layer. In other words, seen in a plan view of the carrier top, a material of the potting layer then completely surrounds the semiconductor chips as well as the connecting means and the contact points in a closed track. In this case a material of the potting layer is preferably in direct contact with the semiconductor chip, the contact points and/or the connecting means in some areas or over the entire surface. The carrier top here can be flat or in a curved shape. With curved carrier tops, it is possible to create e.g. reflector shapes, particularly if the potting layer is applied on to the carrier top in a uniform thickness.

According to at least one embodiment, a material of the potting layer covers side surfaces of the contact points and connecting means completely. The side surfaces in this case are oriented perpendicularly or substantially perpendicularly or obliquely to the carrier top and/or the mounting side. The side surfaces of the semiconductor chips are preferably only partially covered by the potting layer lying closest to the intermediate carrier.

According to at least one embodiment, the method comprises the step of detaching the semiconductor chips from the intermediate carrier. In this step, the connecting means are preferably partially or completely removed from the semiconductor chips. This makes it possible for the contact points to be exposed and to be freely accessible at least in some areas.

According to at least one embodiment, the detaching of the semiconductor chips from the intermediate carrier takes place in such a way that a recess remains in the potting layer at each of the contact points. The recesses each have a shape corresponding to a negative mold of the connecting means previously applied on the contact points. In other words, the potting layer initially surrounds the connecting means completely and the connecting means are then removed, so that the recesses are obtained in the potting layer in place of the connecting means.

According to at least one embodiment, electrical contact structures are generated at the contact points. The electrical contact structures are preferably designed for a mechanical and electrical fixing of the semiconductor components. By means of the contact structures, the finished semiconductor components can be mounted e.g. on a printed circuit board or a heat sink with traces, preferably by soldering or by electrically conductive adhesive bonding.

In at least one embodiment, the method is designed for producing optoelectronic semiconductor components and comprises the following steps:

A) providing an intermediate carrier having a carrier top with multiple fixing points, B) providing optoelectronic semiconductor chips each having a chip top and a mounting side opposite thereto, wherein electrical contact points of the semiconductor chips are located on the mounting sides in each case, C) attaching connecting means locally on the contact points and/or fixing points, D) fixing the contact points and thus the semiconductor chips on the fixing points using the connecting means, E) generating at least one potting layer on the carrier top such that the semiconductor chips and the contact points and the connecting means are directly surrounded laterally by the potting layer and the potting layer is located between the mounting sides and the carrier top, at least in some areas, F) detaching the semiconductor chips from the intermediate carrier such that the connecting means are removed from the semiconductor chips and recesses are obtained at each of the contact points as a negative mold of the connecting means, and G) generating electrical contact structures at the contact points.

Method steps C) to G) are preferably performed in the specified order with method steps A) and B) preceding them. Method steps A) and B) can also be exchanged with one another in terms of the order in which they are performed.

In the method described here, the recesses are formed in the potting layer by the connecting means which can be applied reversibly at the contact points. The recesses thus act as a mold for the electrical contact structures to be generated later. This makes it possible to dispense with a photolithographic patterning of the electrical contact structures. Since photolithographic patterning steps are relatively cost-intensive, the method described here can therefore be carried out cost-effectively.

According to at least one embodiment, in step G) the electrical contact structures are introduced into the recesses in such a way that the contact structures fill the recesses completely. In this case the contact structures generated can be flush with the potting layer in a direction away from the semiconductor chips, in particular with a tolerance of no more than 0.4 µm or 1 µm or 2 µm or 5 µm. Alternatively, it is possible that the contact structures project beyond the potting layer in a direction away from the semiconductor chips.

According to at least one embodiment, the finished contact structures each partly cover a lower side of the potting layer facing away from the semiconductor chips. In other words, an average diameter of the contact structures decreases in a direction towards the semiconductor chips, at least in some areas.

According to at least one embodiment, a material of the electrical contact structures is applied only locally in the recesses and/or close to the recesses. In particular, no continuous layer of a material of the contact structures is generated during generation of the contact structures. In other words, the material of the contact structures is applied at the recesses in insular form. Adjacent recesses in this case are not connected to one another by a continuous track composed of a material of the contact structures. Particularly preferably, the applied material of the contact structures is not subsequently removed again. In other words, the application of the contact structures takes place in a patterned and targeted manner without subsequent material erosion.

According to at least one embodiment, the connecting means are applied locally only on the fixing points. In other words, the connecting means are insular regions, seen in a plan view of the carrier top, which are located only on the fixing points. Adjacent fixing points in this case are not connected to one another by a material of the connecting means. In step C), after the application of the material for the connecting means, no subsequent removal of part of this material preferably takes place.

According to at least one embodiment, the connecting means are each formed from a thermoplastic material and in particular from a thermoplastic polymer. The thermoplastic material preferably has a processing temperature and/or melting point of at least 50° C. or 100° C. or 150° C. or 175° C. and/or no more than 350° C. or 275° C. or 220° C.

According to at least one embodiment, the intermediate carrier is heated in step D) to a temperature above room temperature, i.e. above 23° C. The temperature of the intermediate carrier here is below the processing temperature of the thermoplastic material. The processing temperature of the thermoplastic material is in particular a temperature at which a firm mechanical connection between the semiconductor chips and the intermediate carrier can be generated by the connecting means.

According to at least one embodiment, the temperature of the semiconductor chips in step D) is above the processing temperature of the thermoplastic material. In other words, the semiconductor chips are relatively hot when pressed on to the connecting means. As a result of pressing the hot semiconductor chips on to the connecting means, the connecting means are briefly taken above the processing temperature. This preferably results in a temporary melting or fusing of the connecting means, such that the semiconductor chips adhere to the connecting means.

According to at least one embodiment, the semiconductor chips are placed on the connecting means using a pick-and-place tool in step D). The semiconductor chips are preferably heated by the pick-and-place tool in this case. The heating takes place at least or exclusively during a movement of the semiconductor chips by the pick-and-place tool. In other words, while the pick-and-place tools are moved e.g. from a wafer on to the intermediate carrier, the semiconductor chips are heated "on the fly". The heating preferably takes place to a temperature just above, i.e. for example at least 10° C. or 25° C. and/or no more than 100° C. or 50° C. above, the melting point of the thermoplastic material of the connecting means.

According to at least one embodiment, the contact points have a greater diameter than the connecting means, seen in a plan view of the mounting side. In particular, the contact points project beyond the associated connecting means all the way round, seen in a plan view.

According to at least one embodiment, the finished contact structures have a greater diameter than the contact points and/or connecting means. In particular, the contact structures cover the contact points and/or the connecting means completely, seen in a plan view.

According to at least one embodiment, an anti-adhesive layer, e.g. a layer of a perfluorinated material such as polytetrafluoroethylene, is applied in some areas on the carrier top of the intermediate carrier. In some areas, adhesion of the connecting means and/or potting layer to the intermediate carrier is reduced or prevented by the anti-adhesive layer. For example, an anti-adhesive layer of this type can make it possible for a material of the molten connecting means not to be spread evenly over the carrier top and particularly not beyond the fixing points or specific, predetermined portions of the fixing points.

According to at least one embodiment, the potting layer is designed to reflect the radiation emitted by the semiconductor chip during operation. In particular, the potting layer is also opaque to this radiation. For example, the potting layer appears white to an observer.

According to at least one embodiment, a component bottom of the finished semiconductor components is formed completely by the potting layer together with the contact structures. In other words, at the bottom the component is formed exclusively by the contact structures and the potting layer.

According to at least one embodiment, at least method steps C) to G) are free from photolithographic patterning processes. In particular, the contact structures are applied only locally and thus in patterned form, especially only in the region of the recesses in the potting layer.

According to at least one embodiment, the fixing points on the carrier top are formed by platforms. In other words, the fixing points in this case project beyond remaining regions of the carrier top. A projection of the platforms beyond the remaining regions of the carrier top is e.g. at least 0.5 µm or 1 µm or 2 µm and/or no more than 10 µm or 5 µm or 2 µm. The platforms are covered by the connecting means only incompletely, particularly in steps D) and E).

According to at least one embodiment, the platforms are completely surrounded by the potting body in step E). In other words, side surfaces of the platforms in this case are preferably completely covered by a material of the potting layer and are in direct contact therewith.

According to at least one embodiment, the contact structures are flush with the potting layer after step G) in a direction away from the semiconductor chips, preferably with a tolerance of no more than 5 µm or 2 µm or 0.5 µm. Alternatively, it is possible that the contact structures project beyond the potting layer in a direction away from the semiconductor chips.

According to at least one embodiment, multiple potting layers are generated in method step E), which layers preferably follow one another directly. In this case, the potting layer which is in contact with the contact points and is closest to the intermediate carrier preferably extends to no more than 10% or 25% or 45% of a thickness of the semiconductor chips in a direction away from the intermediate carrier. In other words, only a small part of the side surfaces of the semiconductor chips is then covered by this potting layer.

According to at least one embodiment, one or more of the potting layers comprise(s) at least one phosphor. The phosphor is designed to convert part or all of the radiation emitted by the semiconductor chip during operation to radiation of a different, higher wavelength.

According to at least one embodiment, precisely two, precisely three, precisely four or more than four potting layers are present. The potting layers preferably differ from one another at least partly in terms of their optical properties. For example, precisely one potting layer having a phosphor is present, which is embedded between two transparent potting layers. The potting layer at the contact points is preferably in a reflective form.

According to at least one embodiment, all the potting layers are continuous, uninterrupted layers immediately after step E). In other words, each of the potting layers in this case is applied over the entire surface without any gaps.

According to at least one embodiment, one or more of the potting layers is/are shaped like a lens, at least in part. In this case, in particular a convex lens shape can be created by the potting layers. Each of the lens shapes can be associated with precisely one of the semiconductor chips.

According to at least one embodiment, one of the potting layers has a flat potting layer top which faces away from the semiconductor chip. This flat potting layer top is preferably present in the finished semiconductor components. As a result, it is possible that the finished semiconductor components are cuboid in shape, i.e. cubic, or cube-shaped.

According to at least one embodiment, of the method, the potting layer or at least one of the potting layers is produced from or using a film, also referred to as foil. For this purpose, at least one film is initially applied in step E), after step D).

The film or at least one of the films has pre-produced holes for the semiconductor chips. The at least one film is applied on to the intermediate carrier in such a way that the semiconductor chips are located in the holes. Next, the at least one film is melted or fused or, alternatively or in addition, a further potting material is introduced such that the at least one film and/or the further potting material come(s) into direct contact with the contact points, the connecting means and the semiconductor chips. By means of this type of molding, the at least one potting layer is formed.

Furthermore, an optoelectronic semiconductor component is provided. The semiconductor component is preferably produced by a method as provided in association with one or more of the above-mentioned embodiments. Features of the method are therefore also disclosed for the semiconductor component and vice versa.

In at least one embodiment, the semiconductor component comprises one or more LED chips having a chip top and a mounting side opposite thereto. Electrical contact points of the at least one LED chip are located exclusively on the mounting side. The semiconductor component further includes at least one potting layer and electrical contact structures on the contact points. The LED chip, the contact points and the contact structures are directly surrounded laterally by the potting layer. The potting layer here is opaque and reflective to radiation emitted by the LED chip during operation. Furthermore, the potting layer is preferably electrically insulating. The potting layer, together with the electrical contact structures, forms a complete component bottom. Seen in a plan view of the component bottom, the contact structures preferably have a greater diameter than the contact points. Furthermore, the contact structures preferably decrease in size in a direction towards the mounting side in some regions. As a result, in some areas the potting layer is located between the contact structures and the contact points in a direction perpendicular to the mounting side.

A method as described here and an optoelectronic semiconductor component as described here are explained in more detail below with reference to the drawing with the aid of exemplary embodiments. In the individual figures, identical elements are indicated by the same reference numbers. The illustrations are not to scale, however; rather, to aid understanding, the size of individual elements may be exaggerated.

Figure 2:
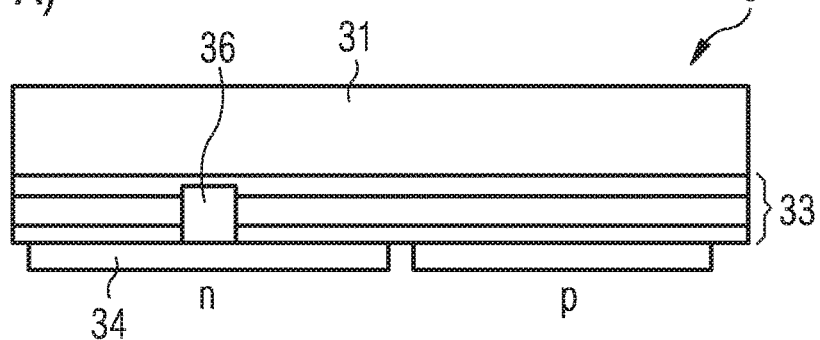
Figure 2:
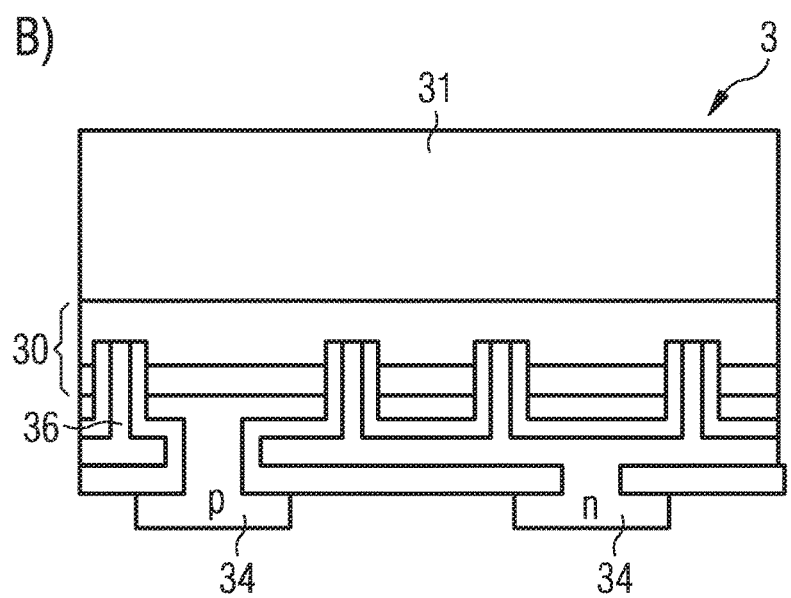
Figure 2:
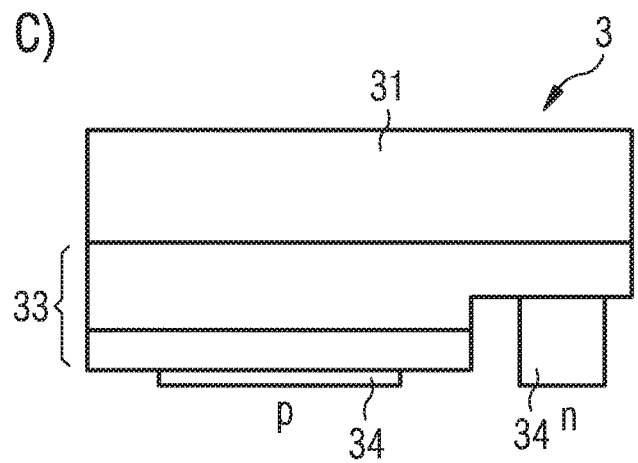
Figure 3:
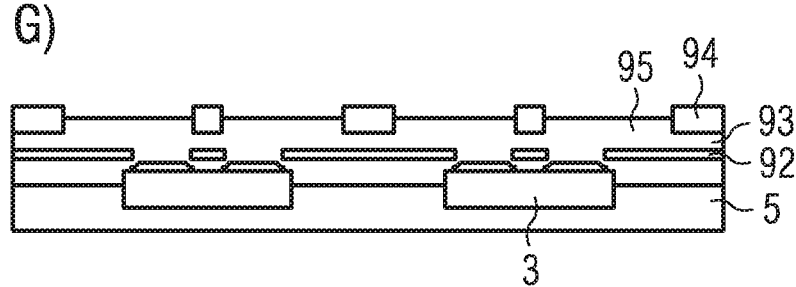
Figure 3:
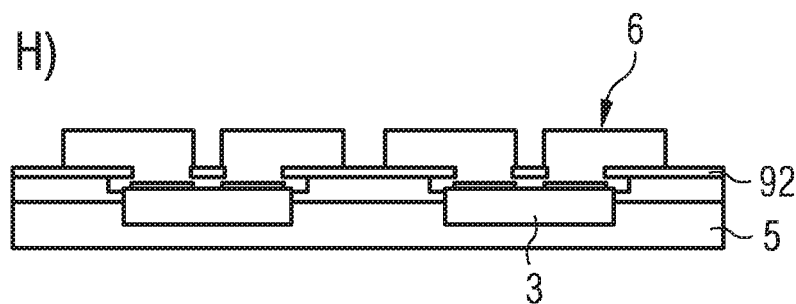
Figure 3:
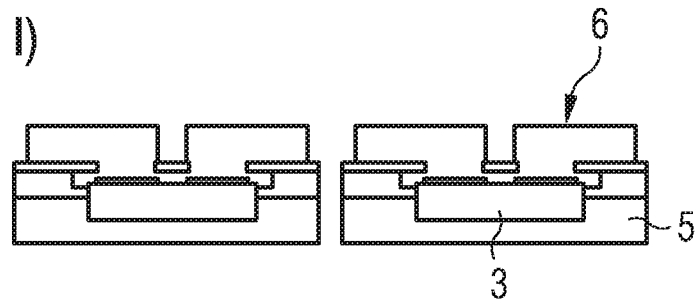
Figure 4:
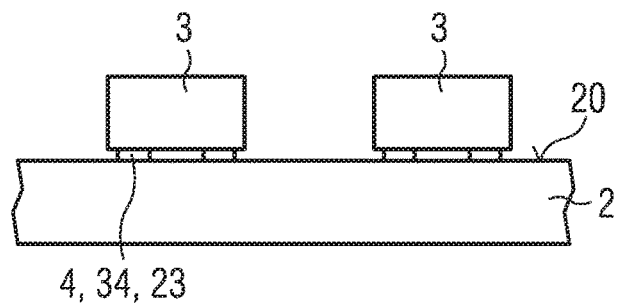
Figure 4:
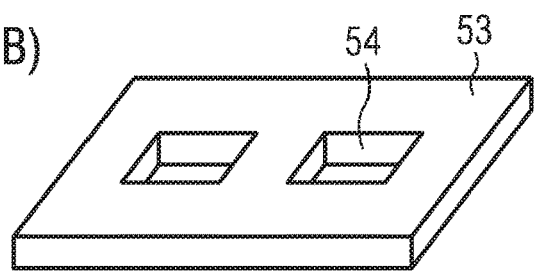
Figure 4:
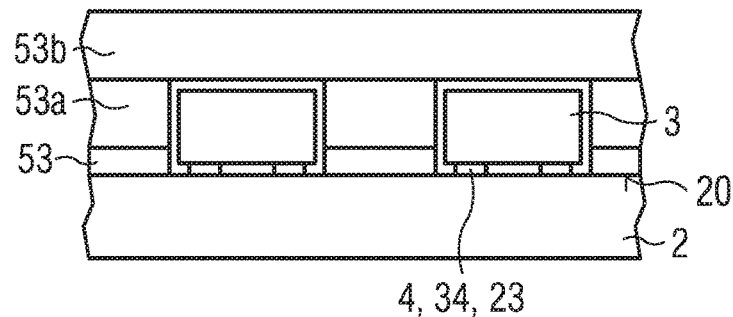
Figure 4:
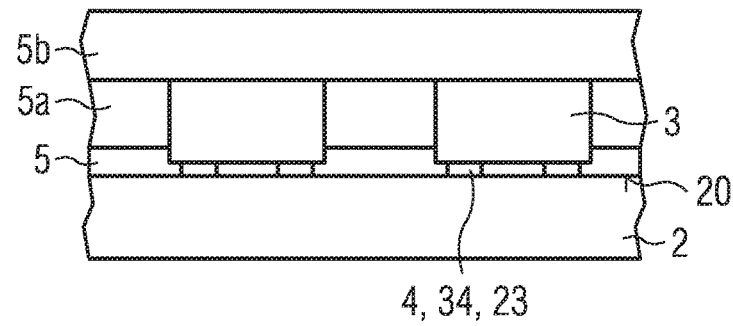
Figure 5:
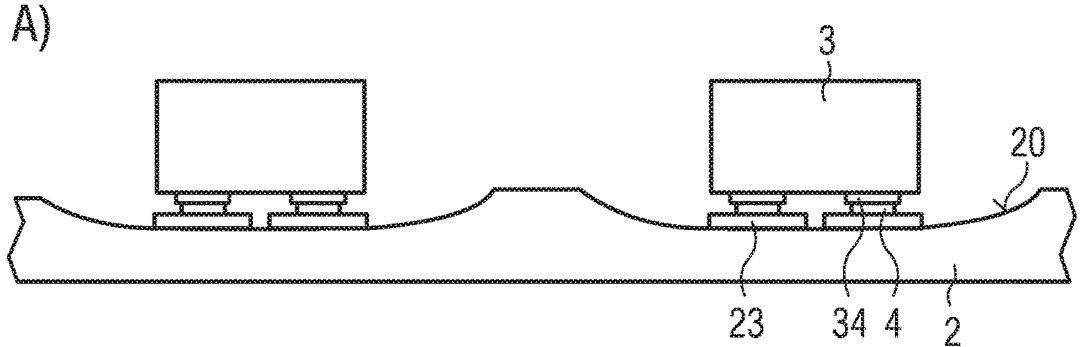
Figure 5:
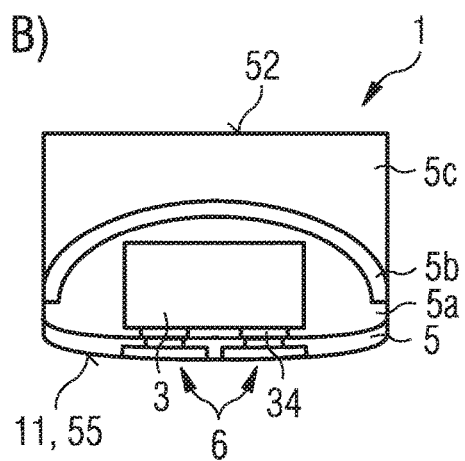
Figure 5:
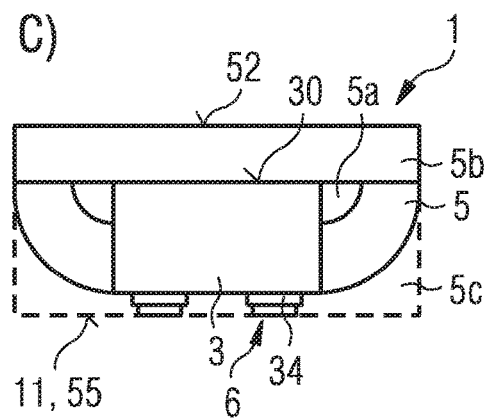

The figures show the following:

FIGS. 1, 4 and 5 show cross-sectional diagrams of method steps of a method as described here for producing optoelectronic semiconductor components as described here, FIG. 2 shows cross-sectional diagrams of optoelectronic semiconductor chips for optoelectronic semiconductor components as described here, and FIG. 3 shows cross-sectional diagrams of a modification of a method.

In FIG. 1, an exemplary embodiment of a method for producing optoelectronic semiconductor components 1 is shown.

According to FIG. 1A, multiple optoelectronic semiconductor chips 3, in particular LED chips, are provided. The LED chips 3 have a chip top 30 and a mounting side 32 opposite thereto. Electrical contact points 34 of the semiconductor chips 3 are located on the mounting side 32. The semiconductor chip 3 is preferably a volume emitter, which is designed to emit radiation on the chip top 30 and also on side surfaces.

Furthermore, an intermediate carrier 2 is provided. The intermediate carrier 2 is preferably thermally stable. This can mean that the intermediate carrier 2 is heat-resistant and mechanically stable at temperatures of e.g. 250° C. or 300° C. For example, the intermediate carrier 2 is formed by a sheet of glass, a metal foil, a ceramic disc, a wafer composed of e.g. silicon, a sheet of metal composed of e.g. molybdenum or a thermoplastic polymer. Composite materials can also be employed for the intermediate carrier 2.

Multiple fixing points 23 are located on a carrier top 20 of the intermediate carrier 2. The fixing points 23 preferably rise up like a platform above remaining regions of the carrier top 20.

Optionally, as in all the other exemplary embodiments, an anti-adhesive layer 7, e.g. a polytetrafluoroethylene layer, can be located on the carrier top 20 and also on the fixing points 23 in some areas. Detaching of the subsequently produced semiconductor components 1 from the intermediate carriers 2 is facilitated by this anti-adhesive layer 7.

Furthermore, according to FIG. 1A, multiple connecting means 4 are applied. The connecting means 4 are applied either directly on the fixing points 23, cf. the left-hand half of the figure, or on the contact points 34, cf. the right-hand side of the figure. The anti-adhesive layer 7 can ensure that no flowing of the connecting means 4 occurs when the semiconductor chips 3 are joined to the intermediate carrier 2, cf. also FIG. 1B.

If the connecting means 4 are applied on to the intermediate carrier 2 as shown in FIG. 1A, left-hand side, the intermediate carrier 2 is preferably held at a temperature below a processing temperature, in particular a melting point, of the connecting means 4. For example, the intermediate carrier 2 has a temperature of approximately 80° C. The semiconductor chips 3 are brought to the melting point of the connecting means 4 in particular by a pick-and-place tool, in particular on the fly. The semiconductor chips then have a temperature of e.g. about 200° C. In this case the connecting means 4 can be the material "Waferbond HT-10.10 Temporary Bonding Material". Other suitable materials for the connecting means 4 are acrylonitrile-butadiene-styrene, abbreviated as ABS, polyamides, abbreviated as PA, polylactate, abbreviated as PLA, polymethyl methacrylate, abbreviated as PMMA, polycarbonate, abbreviated as PC, polyethylene terephthalate, abbreviated as PET, polyethylene, abbreviated as PE, polypropylene, abbreviated as PP, polystyrene, abbreviated as PS, polyether ether ketone, abbreviated as PEEK, polyvinyl chloride, abbreviated as PVC, celluloid, polyolefins.

If the connecting means 4 are applied on to the semiconductor chips 3 in advance, cf. FIG. 1A, right-hand side, the intermediate carrier 2 is preferably heated locally, e.g. electrically or optically.

Preferably, a relatively large number of the semiconductor chips 3 are fixed on the intermediate carrier 2 in the form of a matrix, cf. also FIG. 1C. FIG. 1C further shows that a first potting layer 5 is applied. The potting layer 5 is preferably a radiation-reflecting material. In particular, the first potting layer 5 is a silicone layer, to which titanium dioxide scattering particles are added, e.g. in a proportion by mass of approximately 25%. As a result, the first potting layer 5 appears diffusely reflective and white.

The first potting layer 5 forms a potting layer bottom 55 facing towards the carrier 2. The first potting layer 5 completely surrounds the connecting means 4, the fixing points 23 and the electrical contact points 34 in a form-fit manner. All of the regions of the mounting side 32 not covered by the contact points 34 are covered by the first potting layer 5.

Differing from the illustration, it is possible that the reflective first potting layer 5 covers side surfaces of the semiconductor chips 3 not just partially but completely. According to FIG. 1C, however, the first potting layer 5 extends in a direction away from the intermediate carrier 2 only to just above the mounting side 32. For example, the first potting layer 5 covers the side surfaces of the semiconductor chips 3, measured from the mounting side 32, with a height of at least 5 µm or 10 µm or 25 µm and/or with a height of no more than 100 µm or 50 µm or 15 µm. A total thickness of the first potting layer 5 is e.g. between 10 µm and 50 µm or between 15 µm and 40 µm.

A thickness of the electrical contact points 34 is e.g. at least 200 nm or 400 nm and/or no more than 5 µm or 2 µm. The thickness of the connecting means 4 is preferably at least 0.5 µm or 1.5 µm and/or no more than 5 µm or 2 µm. Furthermore, the platform-like fixing points 23 have, in particular, a height of at least 0.5 µm or 2 µm and/or of no more than 100 µm or 50 µm or 25 µm or 5 µm or 2.5 µm.

FIG. 1D shows that an optional, second potting layer 5a is applied. For example, the second potting layer 5a is generated by spraying or by transfer molding. The second potting layer 5a can also be printed on. In particular, the second potting layer 5a is a layer of a transparent material, e.g. a silicone layer. On the semiconductor chips 3, the second potting layer 5a can be formed in the shape of a lens, in particular similar to convex lenses. In other words, the second potting layer 5a in this case is formed in the shape of a dome and/or sphere on the semiconductor chips 3.

It can be seen in FIG. 1E that a third potting layer 5b is applied on to the second potting layer 5a, e.g. by overspraying or printing. Alternatively, the third potting layer 5b can be a film, which is laid and/or laminated on. A material of the third potting layer 5b is preferably also a silicone. Furthermore, the third potting layer 5b can contain a phosphor or a mixture of phosphors. A thickness of the third potting layer 5b is in particular at least 10 µm or 20 µm and/or no more than 100 µm or 60 µm.

In addition, it can be seen in FIG. 1E that a fourth potting layer 5c is applied, e.g. by molding. A material of the fourth potting layer 5c is again preferably a silicone. Furthermore, the fourth potting layer 5c is preferably clear and transparent, but can alternatively comprise particles, e.g. for light scattering or coloring. A potting layer top 52 is formed by the fourth potting layer 5c.

According to FIG. 1F, the intermediate carrier 2 and the connecting means 4 are detached. This takes place e.g. by heating and pushing off the intermediate carrier 2. Likewise, it is possible for the connecting means 4 to be detached by laser ablation. In this case the intermediate carrier 2 is preferably a light-transmitting carrier, e.g. a glass carrier.

By detaching the intermediate carrier 2 and disconnecting the connecting means 4, recesses 44 are obtained. The recesses 44 represent a negative mold of the fixing points 23 and the connecting means 4, as present in the method step according to FIG. 1E. In other words, the electrical contact points 34 are then exposed in some areas or completely. Preferably, the contact points 34 are exposed only in some areas.

FIG. 1G shows that electrical contact structures 6 are formed on the electrical contact points 34. The electrical contact structures 6 fill the recesses from the method step according to FIG. 1F preferably completely and can be flush with the potting layer bottom 55. The contact structures 6 are produced in particular by a printing method, e.g. by screen printing. The contact structures 6 are preferably formed from at least one metal or at least one metal alloy. For example, a material for the contact structures 6 is an alloy with Sn, Ag and/or Cu. The contact points 34 can be produced from a material composition differing from that of the contact structures 6 and can comprise or consist of e.g. Ti, Au, Pt, Pd and/or Ni.

In the method step as illustrated in FIG. 1H, singulation takes place to obtain the finished semiconductor components 1. During this singulation it is possible that only the potting layers 5, 5a, 5b, 5c, which are all preferably formed from soft materials, especially from silicone materials, have to be severed. During singulation, the dome-shaped regions of the second potting layer 5a remain preferably completely intact.

A component bottom 11 of the finished semiconductor components 1 is thus formed completely by the first potting layer 5 and the contact structures 6. An area of the contact structures 6, seen in a plan view of the component bottom 11, is preferably greater than an area of the contact points 34. In a direction towards the semiconductor chips 3, the contact structures 6 have a smaller area and/or a smaller diameter in some areas than directly on the component bottom 11. In other words, an area of the contact structures 6 can be expanded relative to an area of the contact points 34 by the method described here.

In addition, the contact structures 6 in this arrangement can absorb thermal strains, this being made possible in particular by the region of the contact structures 6 close to the contact points 34 with a reduced diameter. Because of the relatively thin first potting layer 5, furthermore, a relatively large emitting area can be achieved; in particular, an emission of light at the side surfaces of the semiconductor chips 3 is possible. The shaping of the further potting layers 5a, 5b, 5c enables the optical properties to be specifically adjusted in terms of beam trajectory and wavelength.

FIG. 2 shows examples of semiconductor chips 3 which can be processed by the method described in FIG. 1. According to FIGS. 2A and 2B, the semiconductor chips 3 each comprise a substrate 31 on which a semiconductor layer sequence 33 is applied. Through an active zone, a via 36, cf. FIG. 2A, is present or multiple vias 36, cf. FIG. 2B, are present. In particular, the semiconductor chips 3 according to FIGS. 2A and 2B are formed as specified in the document US 2010/0171135 A1. The disclosure content of this document is hereby incorporated by reference.

In the semiconductor chip 3, as shown in FIG. 2C, the semiconductor layer sequence 33 is removed through an active zone in a marginal region. The contact points 34 are thus applied directly on to a p-type layer and an n-type layer of the semiconductor layer sequence 33.

A modification of the production method according to FIG. 1 is sketched in FIG. 3. According to FIG. 3A, the semiconductor chips 3 are pressed with the contact points 34 on to a fixing tape 91, which is located on the intermediate carrier 2. The contact points 34 in this case can be partially or completely pressed into the fixing tape 91.

Next, a potting layer 5 and optionally an intermediate further potting layer 5a are formed, cf. FIG. 3B. The fixing tape 91 and the intermediate carrier 2 are then removed, cf. FIG. 3C.

After this, an electrical insulation layer 92 is applied, with the electrical contact points 34 preferably remaining exposed, cf. FIG. 3D. As shown in FIG. 3E, a metal growth layer 93, also known as a metallization seed layer, is generated over the entire surface, e.g. by sputtering.

According to FIG. 3F, a photomask 94 is applied and patterned. The generation of a metallizing 95 then takes place, cf. FIG. 3G, in particular by electroplating.

According to FIG. 3H, the metallizing 95 and the metal growth layer 93 are then etched to form the electrical contact structures 6. A singulation into semiconductor components is shown in FIG. 3I.

In the method according to FIG. 3, at least one photomask 94 should be applied in order to generate the contact structures 6. In the method as illustrated in FIG. 1, no photolithographic patterning and thus no photomask is needed to generate the contact structures 6. As a result, the method according to FIG. 1 can be carried out more cost-effectively.

In FIG. 4, a further production method according to the invention is provided. According to FIG. 4A, the semiconductor chips 3 are applied on the intermediate carrier 2 as in FIGS. 1A and 1B. To simplify the illustration, the contact points 34, the connecting means 34 and the fixing points 23 are only drawn as a combined whole in FIG. 4.

FIG. 4B provides a perspective drawing showing that a film 53 is provided for the subsequent potting layer 5. The film 53 has multiple holes or apertures 54, which are provided for the semiconductor chips 3.

According to FIG. 4C, the film 53 from FIG. 4B is applied to the intermediate carrier 2, wherein the semiconductor chips 3 are placed in the apertures 54. The film 53 here can be arranged at a distance from the semiconductor chips 3. Further films 53a, 53b are optionally applied and stacked one on top of another. The uppermost film 53b here is a continuous film, which preferably includes a phosphor or a phosphor and additional scattering particles for light scattering, as is also possible in all the other exemplary embodiments. It is possible in this case that the lowest film 53 is thinner than the middle film 53a. For the rest, with regard to the films 53, 53a, the same can apply as to the potting layers 5, 5a, 5b from FIG. 1.

Differing from the illustration, it is possible that only a single film is used which, instead of continuous apertures 54, has only blind apertures for the semiconductor chips 3.

In the method step as shown in FIG. 5D, by molding, the films 53, 53a, 53b are melted or fused and/or shaped by the action of pressure and firmly connected together such that the potting layers 5, 5a, 5b are obtained by means of molding. During this shaping, at least the lowest films 53, 53a are placed directly against the semiconductor chips 3 with the contact points 34. The lowest film 53 surrounds the connecting means 34 and the fixing points 23.

Alternatively or in addition to the method step of FIG. 4D, a further potting material can be employed to connect the films 53, 53a, 53b to one another and to the semiconductor chips 3 durably. Preferably, however, no such additional material is present.

The further method steps are not shown in FIG. 4 and can be carried out in the same way as in FIGS. 1F to 1H.

It is shown in FIG. 5A that the carrier top 20 is in a curved shape. In particular, the carrier top 20 is curved only in regions next to and outside the fixing points 23 and can be flat in the region of the fixing points 23 and between these. The carrier top 20 preferably slopes upwards in a direction away from the fixing points 23.

In FIG. 5B, the semiconductor component 1 produced with such an intermediate carrier 2 is shown; the intermediate steps not illustrated preferably take place according to FIGS. 1C to 1H. The first potting layer 5 is uniformly thick, as is also the case in FIG. 1C. Because of the curved carrier top 20, however, cf. FIG. 5A, the first potting layer 5 is in the form of a convex reflector. For the rest, the semiconductor component 1 of FIG. 5B corresponds to that of FIG. 1H.

In the exemplary embodiment of FIG. 5C, the optional fourth potting layer 5c is located on the component bottom 11. Thus, the fourth potting layer 5c planarizes the component bottom 11 in comparison with FIG. 5B.

Furthermore, it is possible that the diffusely reflecting first potting layer 5 extends to a plane defined by the chip top 30 and is preferably flush with the chip top 30. A region between the first potting layer 5 and the semiconductor chip 3 is preferably filled completely by the transparent second potting layer 5a, which is thus in the shape of a frame in a plan view.

The third potting layer 5b in the form of a conversion layer extends in a constant thickness across the entire semiconductor component 1 and it alone forms the potting layer top 52, as can also be the case in all the other exemplary embodiments. The first, second and/or third potting layer 5, 5b, 5c is/are preferably flush with one another in a lateral direction, such that the semiconductor component 1 has a rectangular or approximately rectangular cross-section, ignoring the electrical contact structure 6.

The description with the aid of the exemplary embodiments does not limit the invention described here. Rather, the invention includes any new feature and any combination of features, which in particular includes any combination of features in the patent claims, even if this feature or this combination is not per se explicitly stated in the claims or exemplary embodiments.

This patent application claims the priority of the German patent application 10 2015 102 699.6, the disclosure content of which is hereby incorporated by reference.

LIST OF REFERENCE NUMBERS

1 Optoelectronic semiconductor component
11 Component bottom
2 Intermediate carrier
20 Carrier top of the intermediate carrier
23 Fixing points of the intermediate carrier
3 Optoelectronic semiconductor chip
30 Chip top
31 Substrate
32 Mounting side
33 Semiconductor layer sequence
34 Electrical contact point
36 Via
4 Connecting means
44 Recess
5 Potting layer
53 Film
54 Aperture in the film
52 Potting layer top
55 Potting layer bottom
6 Electrical contact structure
7 Anti-adhesive layer
8 Phosphor
91 Fixing tape
92 Electrical insulation layer
93 Metal growth layer
94 Photomask
95 Metallizing

The invention claimed is:
1. A method for producing optoelectronic semiconductor components comprising the steps of:

A) providing an intermediate carrier having a carrier top having multiple fixing points,
B) providing optoelectronic semiconductor chips each having a chip top and a mounting side opposite thereto, wherein electrical contact points of the semiconductor chips are each located on the mounting sides,
C) attaching connecting means locally on the contact points and/or on the fixing points,
D) fixing the contact points and thus the semiconductor chips on the fixing points by means of the connecting means,
E) generating at least one potting layer on the carrier top, such that the semiconductor chips and the contact points and the connecting means are directly surrounded laterally by the potting layer and the potting layer is located at least in some areas between the mounting sides and the carrier top,
F) detaching the semiconductor chips from the intermediate carrier, such that the connecting means are removed from the semiconductor chips and recesses are obtained at the contact points as a negative mold in relation to the connecting means, so that the potting layer initially surrounds the connecting means completely and the connecting means are then removed, so that the recesses are obtained in the potting layer in place of the connecting means, and
G) generating electrical contact structures in the recesses at the contact points, wherein method steps C) to G) are performed in the specified order with method steps A) and B) preceding them.

2. The method according to claim 1,
in which the contact structures each completely fill the recesses and each partially cover a potting layer bottom facing away from the semiconductor chips, and comprising a subsequent step H), in which the potting layer is divided.

3. The method according to claim 1,
in which in step C) the connecting means are applied locally only on the fixing points, wherein each of the connecting means is a thermoplastic material, and wherein in step D) the intermediate carrier has a temperature below a processing temperature of the thermoplastic material and the semiconductor chips are pressed on to the connecting means at a temperature above the processing temperature of the thermoplastic material.

4. The method according to claim 3,
in which in step D) the semiconductor chips are placed on the connecting means using a pick-and-place tool, wherein the semiconductor chips are brought to a temperature above the melting point of the thermoplastic material while being moved by the pick-and-place tool.

5. The method according to claim 1, seen in a plan view of the mounting sides, the contact points have a greater diameter than the connecting means and the finished contact structures have a greater diameter than the contact points and the connecting means.

6. The method according to claim 1, in which an anti-adhesive layer is applied on the carrier top in some areas, wherein the anti-adhesive layer reduces or prevents adhesion of at least one of the connecting means and the potting layer on the intermediate carrier.

7. The method according to claim 1,
in which the semiconductor chip is an LED chip, wherein the potting layer is reflective to the radiation emitted by the semiconductor chip during operation and is electrically insulating, and wherein the potting layer, together with the contact structures, forms a component bottom of the finished semiconductor components.

8. The method according to claim 1, in which the contact structures are applied in patterned form and only locally, wherein at least method steps C) to G) are free from photolithographic patterning processes.

9. The method according to claim 1, in which the fixing points are formed by platforms, which project beyond remaining regions of the carrier top, wherein the connecting means cover the platforms only incompletely, at least in steps D) and E).

10. The method according to claim 1, in which after step G) the contact points are flush with the potting layer in a direction away from the semiconductor chips with a tolerance of no more than 2 µm.

11. The method according to claim 1, in which the semiconductor chips are detached from the intermediate carrier in step F) by fusing or melting of the connecting means.

12. The method according to claim 1, in which multiple potting layers are generated in method step E), wherein the potting layer which is in contact with the contact points extends to no more than 25% of a thickness of the semiconductor chips in a direction away from the intermediate carrier, wherein at least two further potting layers are applied on to this potting layer, one of which contains at least one phosphor.

13. The method according to claim 12, in which immediately after step E) all the potting layers are continuous, uninterrupted layers, wherein one of the potting layers comprises lens-shaped regions and this potting layer is covered by a potting layer having a flat potting layer top such that the finished semiconductor components are cubic in shape.

14. The method according to claim 12, in which in step E) the potting layers are or at least one of the potting layers is initially applied as a film, wherein the film or one of the films comprises pre-produced holes for the semiconductor chips, and the at least one film is subsequently melted or fused or a further potting material is introduced, such that at least one of the at least one film and the further potting material come(s) into direct contact with the contact points, the connecting means and the semiconductor chips.

15. The method according to claim 1, in which the carrier top is in a curved shape, such that the potting layer bottom has a similarly curved shape, wherein the potting layer, or at least the potting layer closest to the intermediate carrier, is applied with a constant thickness such that a side of this potting layer facing away from the carrier top accurately duplicates the shape of the carrier top in regions next to the semiconductor chip seen in a plan view.

16. An optoelectronic semiconductor component produced with the method of claim 1 and comprising an LED chip having a chip top and a mounting side opposite thereto and electrical contact points of the LED chip are located exclusively on the mounting side, least one potting layer and electrical contact structures on the contact points, wherein the LED chip, the contact points and the contact structures are directly surrounded laterally by the potting layer, the potting layer is opaque and reflective to radiation emitted by the LED chip during operation and is electrically insulating, and the potting layer, together with the contact structures, completely forms a component bottom of the semiconductor component, seen in a plan view of the component bottom, the contact structures have a greater diameter than the contact points, and the contact structures reduce in size in a direction towards the mounting side such that, in some areas, the potting layer is located between the contact structures and the contact points.

\* \* \* \* \*